(12) United States Patent
Lin et al.

(10) Patent No.: US 8,546,229 B2
(45) Date of Patent: Oct. 1, 2013

(54) METHODS FOR FABRICATING BIPOLAR TRANSISTORS WITH IMPROVED GAIN

(71) Applicants: Xin Lin, Phoenix, AZ (US); Daniel J. Blomberg, Chandler, AZ (US); Jiang-Kai Zuo, Chandler, AZ (US)

(72) Inventors: Xin Lin, Phoenix, AZ (US); Daniel J. Blomberg, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/760,882

(22) Filed: Feb. 6, 2013

(65) Prior Publication Data

US 2013/0149831 A1  Jun. 13, 2013

Related U.S. Application Data

(62) Division of application No. 13/014,029, filed on Jan. 26, 2011, now Pat. No. 8,384,193.

(51) Int. Cl.
*H01L 21/331* (2006.01)
*H01L 29/70* (2006.01)

(52) U.S. Cl.
USPC ........... 438/338; 438/309; 438/316; 438/335; 438/342; 257/E29.03; 257/E29.114

(58) Field of Classification Search
USPC ... 438/309, 316, 335, 338, 342; 257/E29.03, 257/E29.114
See application file for complete search history.

(56) References Cited

U.S. PATENT DOCUMENTS

| | | | |
|---|---|---|---|
| 6,174,760 B1 | 1/2001 | Cheng et al. | |
| 6,630,377 B1 | 10/2003 | Panday et al. | |
| 6,828,635 B2 | 12/2004 | Panday et al. | |
| 2002/0086489 A1 | 7/2002 | Chatterjee | |
| 2011/0215858 A1* | 9/2011 | Mauder et al. | 327/377 |
| 2012/0133025 A1* | 5/2012 | Clarke et al. | 257/570 |

* cited by examiner

*Primary Examiner* — Thanh V Pham
(74) *Attorney, Agent, or Firm* — Ingrassia Fisher & Lorenz, P.C.

(57) ABSTRACT

Insufficient gain in bipolar transistors (20) is improved by providing an alloyed (e.g., silicided) emitter contact (452) smaller than the overall emitter (42) area. The improved emitter (42) has a first emitter (FE) portion (42-1) of a first dopant concentration $C_{FE}$, and a second emitter (SE) portion (42-2) of a second dopant concentration $C_{SE}$. Preferably $C_{SE} \geq C_{FE}$. The SE portion (42-2) desirably comprises multiple sub-regions (45i, 45j, 45k) mixed with multiple sub-regions (47m, 47n, 47p) of the FE portion (42-1). A semiconductor-metal alloy or compound (e.g., a silicide) is desirably used for Ohmic contact (452) to the SE portion (42-2) but substantially not to the FE portion (42-1). Including the FE portion (42-1) electrically coupled to the SE portion (42-2) but not substantially contacting the emitter contact (452) on the SE portion (42-2) provides gain increases of as much as ~278.

20 Claims, 11 Drawing Sheets

US 8,546,229 B2

METHODS FOR FABRICATING BIPOLAR TRANSISTORS WITH IMPROVED GAIN

CROSS-REFERENCE TO RELATED APPLICATION

This application is a divisional of U.S. application Ser. No. 13/014,029, filed Jan. 26, 2011, now U.S. Pat. No. 8,384,193.

FIELD OF THE INVENTION

The present invention generally relates to semiconductor devices and circuits and methods for fabricating semiconductor devices and circuits, and more particularly relates to semiconductor devices and circuits embodying bipolar transistors.

BACKGROUND OF THE INVENTION

Bipolar transistors are much used in modern electronics as individual devices and as part of various integrated circuits (ICs). The gain (e.g., beta) of such devices is an important property. It has been found that under some circumstances the gain is lower than desired. Accordingly, a need continues to exist for improved bipolar transistors and methods for manufacturing the same, in which the gain can be increased.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
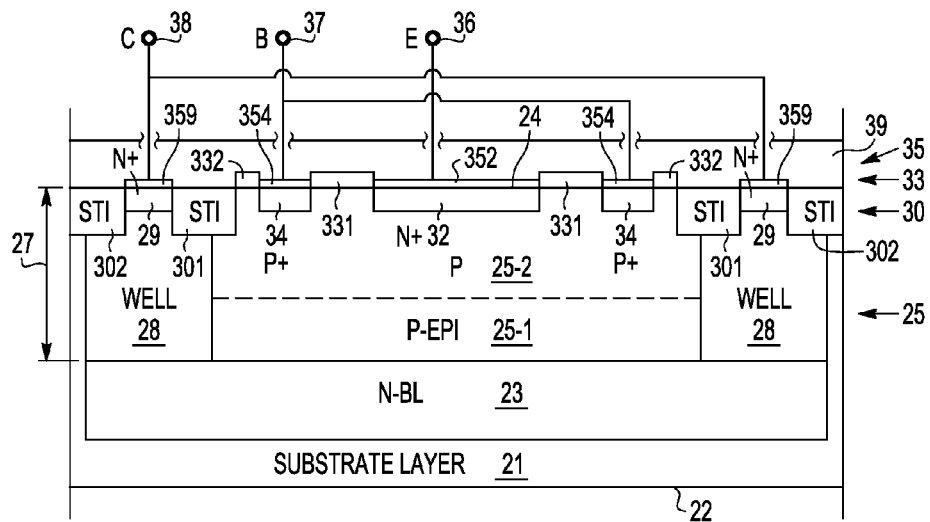
FIG. 1 shows a simplified cross-sectional view of a planar bipolar transistor illustrating a structure, according to the prior art, in which lower than desired gain is encountered.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order or arrangement. It is to be understood that the terms so used are interchangeable under appropriate circumstances such that the embodiments of the invention described herein are, for example, capable of operation or arrangement in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" and the abbreviation "SC" are intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" and "SC substrate" are intended to include single crystal structures, polycrystalline structures, amorphous structures, thin film structures, layered structures as for example and not intended to be limiting, semiconductor-on-insulator (SOI) structures, and combinations thereof.

For convenience of explanation and not intended to be limiting, semiconductor devices and methods of fabrication are described herein for silicon semiconductors, but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or of a "second, opposite conductivity type" where the first type may be either N or P type and the second type is then either P or N type. As used herein, the term "bipolar transistor", singular or plural, is intended to include any type of semiconductor device employing contiguous NPN or PNP regions some of which exhibit minority carrier conduction, even though further doped regions may be included in such devices. Various embodiments of the invention will be illustrated for NPN bipolar transistors, but this is merely for convenience of description and is not intended to be limiting. Persons of skill in the art will understand that PNP transistors and other semiconductor devices and circuits embodying either or both NPN and PNP combinations may be provided by appropriate interchange of conductivity types in the various regions.

Figure 2:
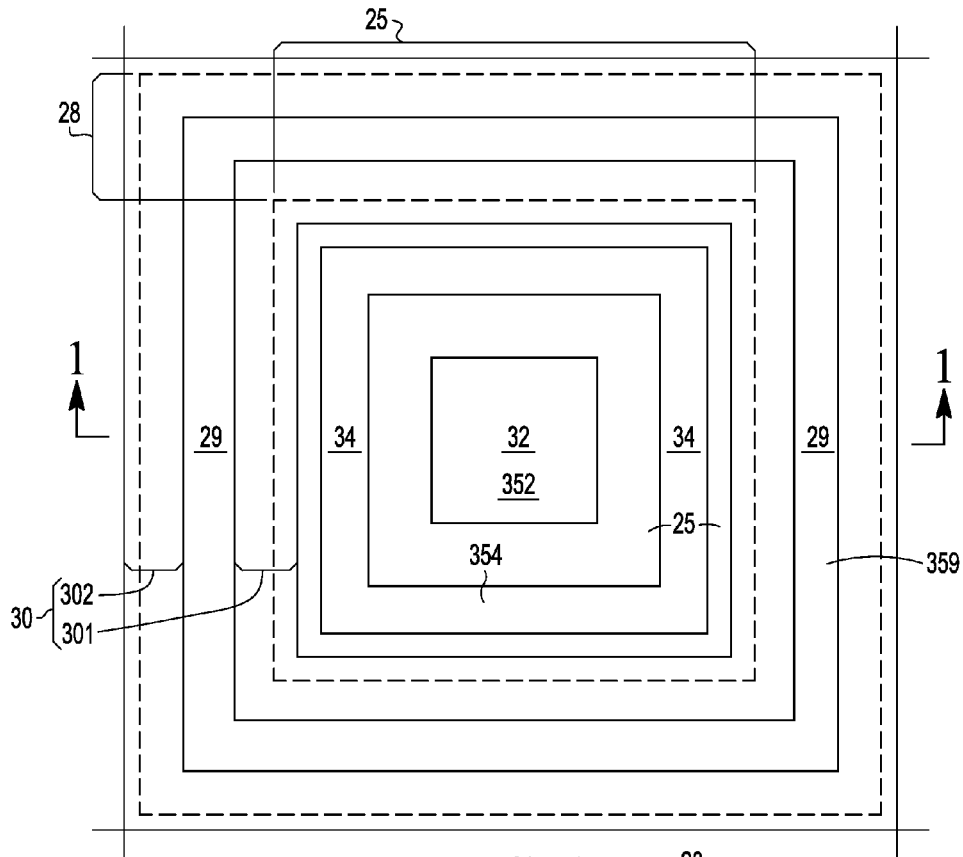
FIG. 2 shows a simplified plan view of the transistor of FIG. 1.

FIG. 1 shows a simplified cross-sectional view of planar bipolar transistor 20, according to the prior art, illustrating a structure in which lower than desired gain is encountered. FIG. 2 shows a simplified plan view of transistor 20 of FIG. 1.

FIGS. 1-2 are described together. Transistor 20 comprises substrate layer 21 having lower surface 22. Overlying substrate layer 21 is N type buried layer (BL) 23. Overlying BL 23 and extending to upper or front surface 24 is centrally located P type base region 25 of thickness 27 having lower portion 25-1 and upper portion 25-2. Flanking base region 25 are peripheral N type WELL regions 28 extending from upper or front surface 24 to BL 23. At upper or front surface 24 in WELL regions 28 are N+ collector contacts 29 laterally bounded at surface 24 by shallow trench isolation (STI) regions 30. WELL regions 28 with collector contact 29 provide upper or front surface Ohmic contact to BL collector 23. Shallow trench isolation (STI) regions 30 have portions 301 laterally separating WELL regions 28 from base region 25 at surface 24, and regions 302 laterally separating WELL regions 28 (and transistor 20) from other electronic elements (not shown) located laterally outside of transistor 20. Located within base region 25 at upper or front surface 24 are N+ emitter 32 and P+ base contact 34. Overlying and in Ohmic contact with collector contacts 29, emitter 32 and base contacts 34 are silicided contact regions 359, 352, and 354 respectively, collectively silicide layer or contacts 35. Overlying surface 24 between silicided contact regions 352 and 354, and between silicided contact regions 354 and STI regions 301, are portions 331, 332 respectively of blocking layer 33. In a typical embodiment, STI regions 30, WELL regions 28, collector contact regions 359, base contract regions 354 and the various parts of blocking layer 33 are of annular shape as can be seen in the plan view of transistor 20 shown in FIG. 2. Corresponding regions are identified in FIG. 2 with the same reference numbers as in FIG. 1. Dielectric passivation layer 39 overlies surface 24 and contact layer 35. As indicated schematically in FIG. 1, emitter contact region 352 is coupled to emitter terminal 36, base contact region 354 is coupled to base terminal 37, and collector contact region 359 is coupled to collector terminal 38. Passivation layer 39, terminals 36, 37, 38 and the connections thereto are omitted in FIG. 2 to avoid cluttering the drawing.

Figure 3:
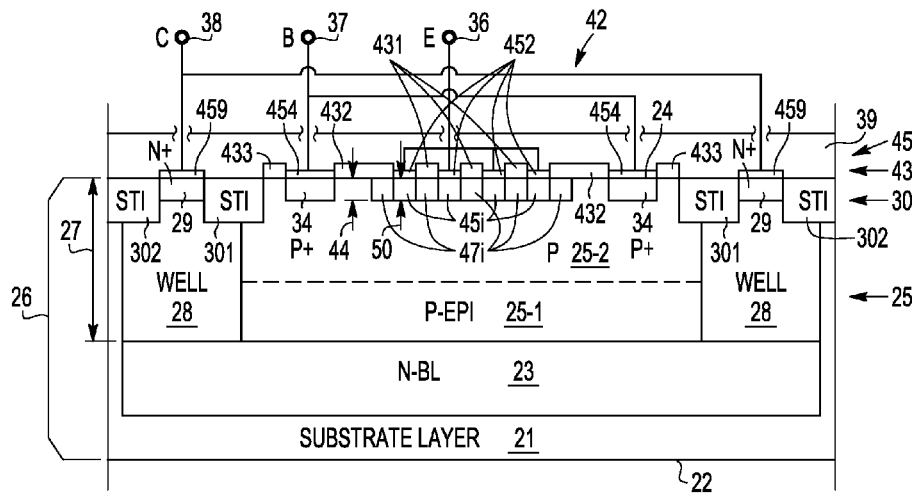
FIG. 3 shows a simplified cross-sectional view of an improved bipolar transistor according to an embodiment of the invention.
Figure 4:
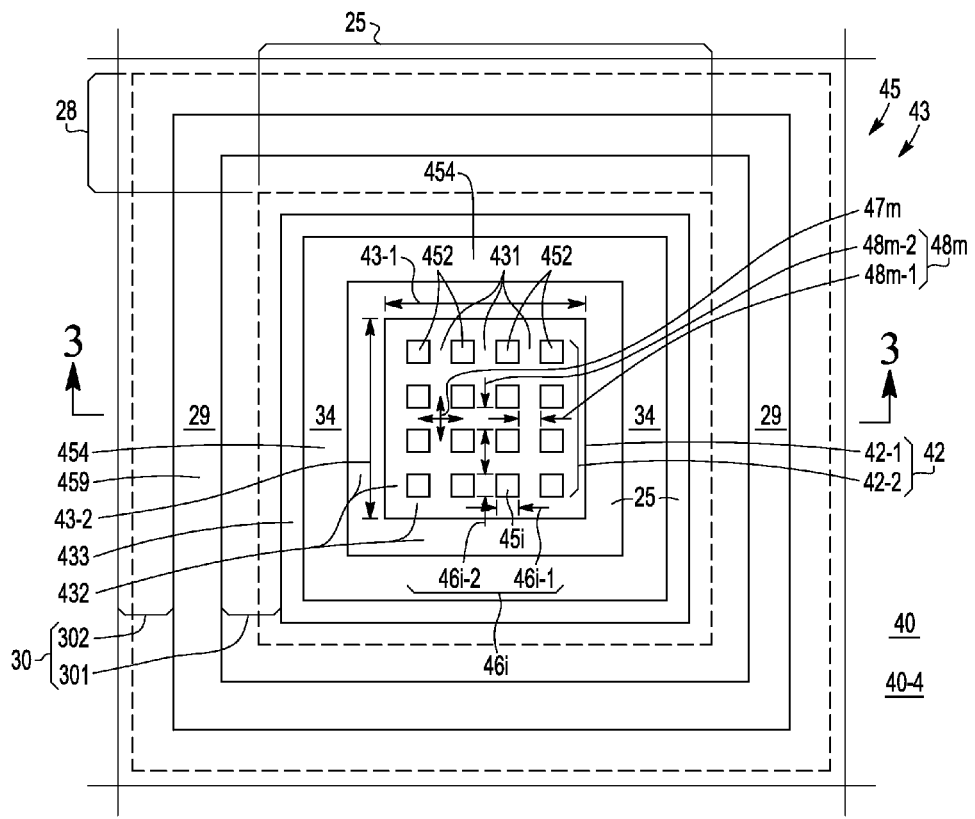
FIG. 4 shows a simplified plan view of the transistor of FIG. 3.
Figure 5:
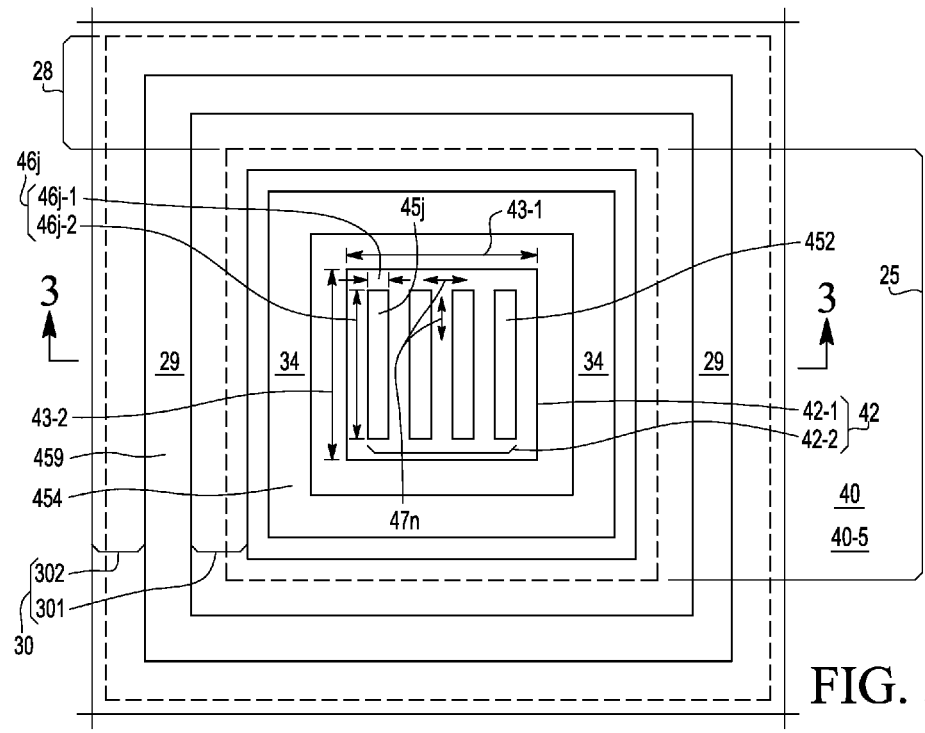
FIGS. 5-6 are simplified plan views analogous to that of FIG. 4, but according to further embodiments of the invention.
Figure 6:
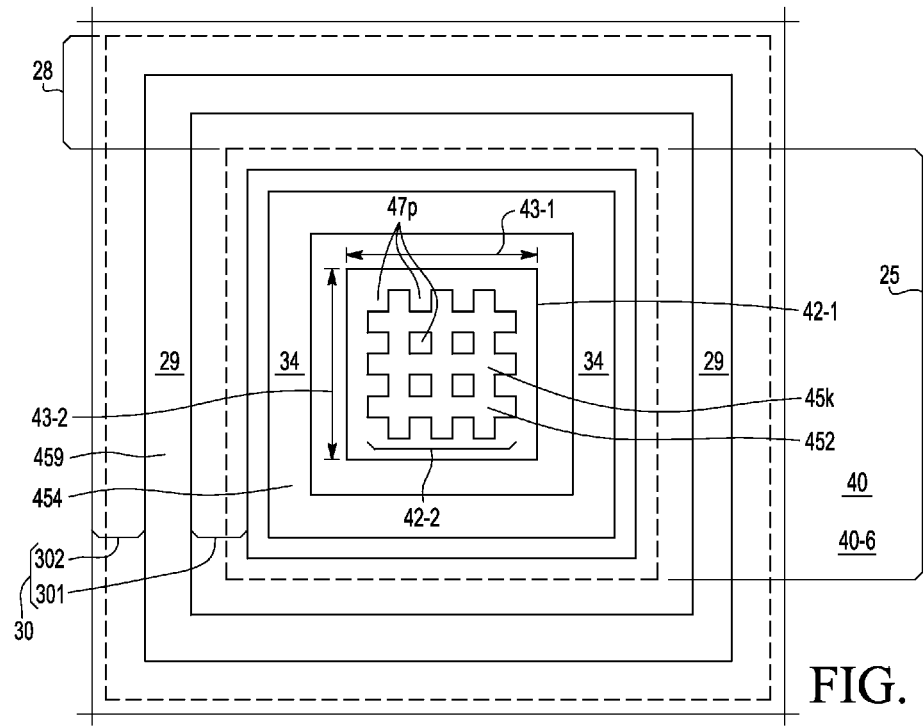

FIG. 3 shows a simplified cross-sectional view of improved bipolar transistor 40 according to an embodiment of the invention, FIG. 4 shows a simplified plan view of transistor 40 of FIG. 3, and FIGS. 5-6 are simplified plan views analogous to that of FIG. 4 but according to further embodiments of the invention. For convenience of explanation, the transistor corresponding to the plan view of FIG. 4 is referred to as transistor 40-4, the transistor corresponding to the plan view of FIG. 5 is referred to as transistor 40-5, and the transistor corresponding to the plan view of FIG. 6 is referred to as transistor 40-6, and all are referred to collectively as transistor 40. FIGS. 3-6 are described together. Reference numbers 21, 22, 23, 24, 25, 27, 28, 29, 30, 34, 36, 37, and 38 are used in FIGS. 3-6 to identify analogous regions or elements described in connection with FIGS. 1-2 and reference should be had to such discussion with respect to such common reference numbers. Reference number 26 is defined in connection with FIG. 10 and identifies the combination of substrate layer 21 and various overlying layers or regions identified in FIG. 10 and also present in FIG. 3.

Transistors 40 of FIGS. 3-6 differs from transistor 20 of FIGS. 1-2, among other things, in the arrangement and structure of emitter 42 and Ohmic contact thereto, which differs substantially from the arrangement and structure of emitter 32 and Ohmic contact thereto of transistor 20. In transistor 20, emitter 32 is a simple geometric structure, e.g., a rectangle, of substantially uniform doping in plan view and substantially entirely covered by (e.g., silicide) emitter contact region 352. In transistor 40, the plan view doping of emitter 42 is desirably not uniform and (e.g., silicide) emitter contact 452 is only on a portion of emitter 42. Transistor 40 has, for example, two or more plan view emitter portions of desirably but not essentially different doping concentration, that is (e.g., see FIGS. 3-4): (A) first emitter (FE) portion 42-1 of a first emitter area (FEA) in plan view and first emitter doping concentration $C_{FE}$, and (B) second emitter portion 42-2 of a second emitter area (SEA) in plan view and a second emitter doping concentration $C_{SE}$, with overlying (e.g., silicide) emitter contact 452 thereon. Second emitter portion 42-2 comprises multiple sub-emitters 45$i$ interspersed with sub-emitters 47$i$ of first emitter portion 42-1 or vice versa. Emitter contact 452 is present on second emitter portion 42-2 but substantially not on first emitter portion 42-1. For convenience of description and not intended to be limiting, in some locations in the text and drawings, the term "first emitter" is abbreviated as "FE" and the term "second emitter" is abbreviated as "SE". Likewise, the term "first emitter area" is abbreviated as "FEA" and the term "second emitter area" is abbreviated as "SEA", where "SEA" is intended to refer to the area of emitter 42 having metal-SC alloy or compound (e.g., silicided) emitter contact 452 thereon.

Referring now to FIGS. 3 and 4, emitter 42 has in this example a substantially rectangular plan view outer shape of lateral dimensions 43 of lateral width 43-1 and lateral height 43-2 (e.g., see FIG. 4) and a total emitter area (TEA)=(dimension 43-1)*(dimension 43-2). SE portion 42-2 comprises, in this example, I=16 individual sub-emitters 45$i$ ($i$=1, 2, 3, . . . I) individually of substantially rectangular plan view shape, laterally dispersed within FE portion 42-1. Each, individual sub-emitter 45$i$ has lateral dimensions 46$i$ of lateral width 46$i$-1 and lateral height 46$i$-2 (e.g., see FIG. 4) and emitter-base junction depth 50 below surface 24 (e.g., see FIG. 3). SE portion 42-2 has lateral SEA=I*(dimension 46$i$-1)*(dimension 46$i$-2), where in this example I=16, but in other embodiments I may have different values. For convenience of explanation, it is assumed in this example that all sub-emitters 45$i$ have the similar lateral dimensions 46$i$-1, 46$i$-2 (collectively 46$i$), but in other embodiments dimensions 46$i$ need not be equal. For example, some or all of sub-emitters 45$i$ may be of different shape, such as round, square, elliptical, polygonal, etc., and/or lateral widths and heights 46$i$-1, 46$i$-2 may be different for various sub-emitters 45$i$, $i$=1, 2, 3, . . . I. Between sub-emitters 45$i$ lie (e.g., vertical and horizontal) "streets" 47$m$ of FE portion 42-1 of lateral width 48$m$-1 and lateral height 48$m$-2 (collectively lateral dimensions 48$m$) and emitter-base junction depth 44 below surface 24 (e.g., see FIG. 3). In the illustration of FIG. 4, sub-emitters 45$i$ of SE portion 42-2 and sub-emitters (e.g., "streets") 47$m$ of FE portion 42-1 are shown as being about of equal size, but this is merely for convenience of illustration and not intended to be limiting. In other embodiments, the size of sub-emitters 45$i$ and sub-emitter "streets" 47$m$ may be different individually and collectively. Since in this example, SE portion 42-2 lies within FE portion 42-1, the area of FE portion 42-1 is given by FEA=TEA−SEA, where FEA=first emitter area, TEA=total emitter area and SEA=second emitter area. Emitter-base junction depth 44 of FE portion 42-1 and emitter-base junction depth 50 of SE portion 42-2 may be the same (preferred) or different. Either arrangement is useful. (Further details concerning the relation between emitter-base junction depths 44 and 50 are given in connection with FIGS. 14 and 16.) It will be understood by those of skill in the art that the power handling capability of transistor 40 depends on the total emitter area (TEA) and that TEA=FEA+SEA can be increased or decreased so as to provide transistor 40 with the desired current handling capability. Since SE portion 42-2 is covered by emitter contact 452, the SEA also corresponds to the area of SC-metal alloy or compound (e.g., silicided) emitter contact 452.

FIGS. 5 and 6 are analogous to FIG. 4 and show further embodiments of the invention. For convenience of explanation and not intended to be limiting, emitter 42 in these examples has substantially the same outer plan view shape as in FIG. 4 and outer dimensions 43-1 and 43-2, while SE portion 42-2 with emitter contact 452 has different plan view shapes in FIGS. 5-6 than in FIG. 4. In still other embodiments, FE portion 42-1 may have different plan view shapes, according to the desires of the device designer and the available manufacturing process.

In the example of FIG. 5, SE portion 42-2 has sub-emitters 45j with emitter contact 452 in the shape of rectangles of lateral width 46j-1 and height 46j-2 lying interspersed with FE portion 42-1. Overall emitter 42 has outer dimensions 43-1, 43-2 (collectively 43). Reference number 47n is used to refer to FE portion 42-1 that lies between or around sub-emitters 45j with emitter contact 452 in FIG. 5. The index j takes on values j=1, 2, 3, ... J, where J=4 in this example, but in other embodiments may have different values, and the index n takes on such values as needed to identify the various parts of FE portion 42-1 lying between and around sub-emitters 45j with emitter contact 452. As before, FEA=TEA−SEA where TEA=(dimension 43-1)*(dimension 43-2) and for transistor 40-5 SEA=J*(dimension 46j-1)*(dimension 46j-2), assuming for convenience of explanation that all sub-emitters with emitter contact 452 have similar individual dimensions. In yet other embodiments, individual sub-emitters 45j with emitter contact 452 may have different lateral dimensions and, as will be understood by those of skill in the art, SEA may also be calculated by summing the areas of individual sub-emitters 45j with emitter contact 452.

In the example of FIG. 6, SE 42-2 with emitter contact 452 is waffle shaped in plan view, as if formed from two sets of rectangles 45k (e.g., each similar to rectangles 45j of FIG. 5) arranged overlapping at right angles to each other. Reference number 45k is used to refer to the various parts of SE portion 42-2 (with emitter contact 452 of transistor 40-6) interspersed within or surrounding various parts 47p of FE portion 42-1. Persons of skill in the art will understand how to calculate TEA and SEA corresponding to emitter contact 452, and therefore also how to determine the FE area FEA=TEA−SEA. As is explained in more fully in connection with FIGS. 10-18, for manufacturing convenience it is preferred that the implant used to form FE portion 42-1 laterally overlaps the implant used to form SE portion 42-2, so that FEA=TEA−SEA, but in yet still further embodiments, the implants to form FE portion 42-1 and SE portion 42-2 with emitter contact 452 may be non-overlapping in whole or part, for example, laterally located substantially side-by-side, or the doping implant to form SE portion 42-2 with subsequent emitter contact 452 may be only partly located laterally within the implant used to form FE portion 42-1. Stated still another way, the plan view mask pattern used to form FE portion 42-1 may or may not include the regions to be occupied by SE portion 42-2 with subsequent emitter contact 452. Either arrangement is useful. In addition to the exemplary embodiments shown in FIGS. 4, 5, and 6, FE portion 42-1 and SE portion 42-2 can have other arrangements as long as they are electrically coupled. For example and not intended to be limiting, SE portion 42-2 with emitter contact 452 can be in the shape of concentric rings or other annular shapes interleaved or mixed with or surrounded by FE portion 42-1. In a preferred embodiment, SC-metal alloy or compound (e.g., silicided) emitter contact 452 (e.g., see FIG. 3) is applied substantially to SE portion 42-2 and substantially not to FE portion 42-1.

It will be noted in connection with the several embodiments illustrated above, that sub-emitters 45i, 45j, 45k of SE portion 42-2 (of second dopant concentration $C_{SE}$) are interspersed with sub-emitters 47m, 47n, 47p of FE portion 42-1 (of first dopant concentration $C_{FE}$) and vice-versa, where the first emitter dopant concentration $C_{FE}$ and the second emitter dopant concentration $C_{SE}$ are desirably but not essentially different. In a preferred embodiment where metal-SC alloy or compound (e.g. silicided) emitter contact 452 (e.g., see FIG. 3) is subsequently formed on sub-emitters 45i, 45j, 45k making up SE portion 42-2, emitter contact 452 is also interspersed with sub-emitters 47m, 47n, 47p of FE portion 42-1. The doping of combined emitter region 42 is desirably but not essentially non-uniform in plan view. Emitter region 42 desirably has a multiplicity of sub-emitter sites (e.g., 45i and 47m in FIG. 4; 45j and 47n in FIG. 5; 45k and 47p in FIG. 6) and the emitter doping concentration desirably differs between such sub-emitter sites, with sub-emitter sites 45i, 45j, 45k having thereon SC-metal alloy or compound (e.g., silicide) emitter contact 452. Stated another way, in plan view, transistors 40 desirably but not essentially have emitters 42 comprising a multiplicity of adjacent regions of different doping density or concentration $C_{FE} \neq C_{SE}$. For example, FE portion 42-1 usefully has first doping concentration $C_{FE}$ in the range of about 1E17 to 1E21 cm$^{-3}$, more conveniently in the range of about 1E18 to 1E20 cm$^{-3}$ and preferably about 7E18 cm$^{-3}$, and SE portion 42-2 usefully has second doping concentration $C_{SE}$ in the range of about 1E19 to 1E22 cm$^{-3}$, more conveniently in the range of about 1E20 to 5E21 cm$^{-3}$ and preferably about 2E21 cm$^{-3}$, but higher and lower doping concentrations can also be used. In a preferred embodiment, the second doping concentration $C_{SE}$ is equal or larger than the first doping concentration $C_{FE}$. Stated another way, in transistors 40 the ratio $C_{SE}/C_{FE}$ is usefully in the range of about $C_{SE}/C_{FE}=10^0$ to $10^4$, more conveniently in the range of about $C_{SE}/C_{FE}=10^1$ to $10^3$ and preferably about $C_{SE}/C_{FE}=3*10^2$. In a preferred embodiment, only a part (e.g., SE 42-2) of emitter 42 has SC-metal alloy or compound (e.g., silicided) emitter contact 452. In a still further embodiment, the doping concentration $C_{FE}$ of FE portion 42-1 and the doping concentration $C_{SE}$ of SE portion 42-2 may be substantially equal provided that SC-metal alloy or compound (e.g., silicided) emitter contact 452 is provided substantially only on SE portion 42-2. When $C_{SE}$ substantially equals $C_{FE}$, then SE portion 42-2 underlies the emitter contact locations, that is locations where (e.g., silicided) emitter contact 452 is provided and the SEA equals the emitter contact area (ECA).

It is found that increasing the FEA and/or decreasing the SEA increases the gain of bipolar transistors 40 compared to prior art transistor 20. In a preferred embodiment, SE portion 42-2 is substantially covered by SC-metal alloy or compound (e.g., silicided) Ohmic emitter contact 452 in FIG. 3-6 while the FE portion 42-1 is substantially not covered by such SC-metal alloy or compound emitter contact 452 (e.g., is not silicided). Thus, in this example, reducing the SEA has the companion effect of also reducing the emitter area with SC-metal alloy or compound (e.g., silicided) emitter contact 452. This is believed to contribute to the increased gain by, for example, decreasing the area (e.g., the SEA) of the SC-metal alloy or compound (e.g., silicided) emitter contact interface near the emitter-base junction where such interface may give rise to higher carrier recombination.

The results of comparative tests are shown in Table I below. The data for (prior art) sample 1 were taken using a device of the type illustrated in FIGS. 1-2 where emitter 32 was substantially covered by silicide 352. The data for samples 2-4 were taken using devices of the type illustrated in FIGS. 4, 6, and other plan-view shapes (not shown) with various values of FEA and SEA. In samples 2-4, FE portion 42-1 underlies blocking layer 43 (see FIGS. 3 and 15-18) and has no overlying metal-SC alloy or compound (e.g., silicided) contact, and SE portion 42-2 is exposed in the openings in blocking layer 43 and is covered with portion 452 of metal-SC alloy or compound (e.g., silicide) forming contact layer 45 during the metallization process, as is explained more fully in connection with FIGS. 10-18. As used in Table I, SEA represents the silicided emitter area, FEA represents the non-silicided emitter area and TEA represents the total area of emitter 42, that is, TEA=FEA+SEA.

TABLE I

TRANSISTOR GAIN FOR DIFFERENT SILICIDED EMITTER AREAS

| Test Sample | Dopant Ratio $C_{SE}/C_{FE}$ | SEA Silicided Area in Sq.-Micrometers | FEA Non-Silicided Area in Sq.-Micrometers | SEA/TEA (%) | Peak Current Gain (Beta) |
|---|---|---|---|---|---|
| 1 | N/A | 9.0 | 0 | 100% | 18 |
| 2 | 300 | 9.0 | 8.6 | 51% | 38 |
| 3 | 300 | 5.8 | 11.8 | 33% | 48 |
| 4 | 300 | 3.2 | 14.4 | 18% | 68 |

It will be apparent that increasing the FEA relative to the SEA and reducing the silicided SEA relative to the non-silicided FEA provides very significant improvements in gain, as much as ~278% for test sample 4 relative to prior art sample 1. This is extremely useful.

Figure 7:
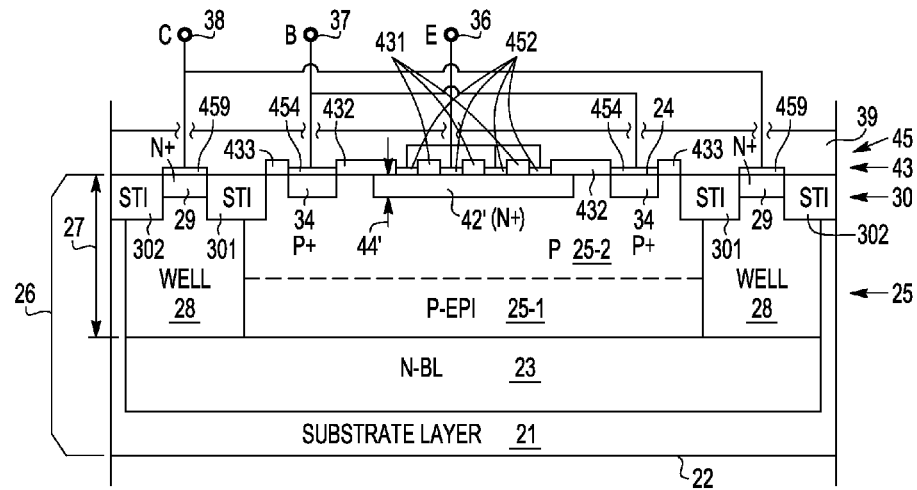
FIG. 7 shows a simplified cross-sectional view of an improved bipolar transistor analogous to that of FIG. 3 but according to a still further embodiment of the invention.
Figure 8:
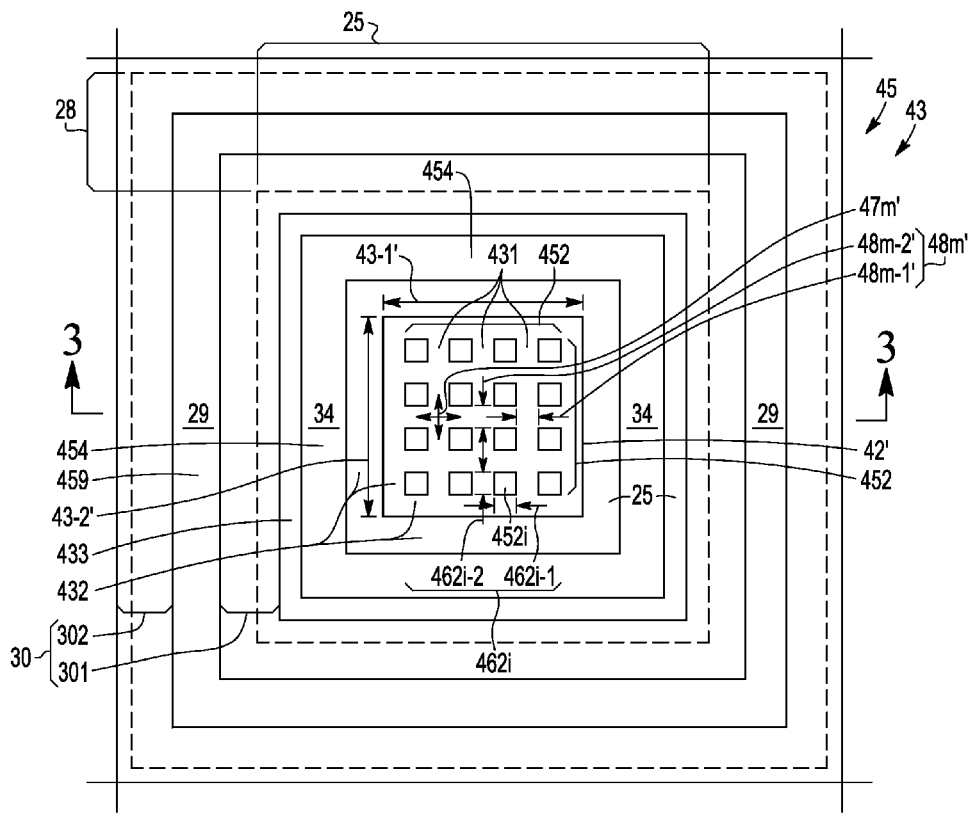
FIG. 8 a simplified plan view of the transistor of FIG. 7.

FIG. 7 shows a simplified cross-sectional view of improved bipolar transistor 40' analogous to transistor 40 of FIG. 3 but according to a still further embodiment of the invention and FIG. 8 is a simplified plan view of transistor 40' of FIG. 7. Transistor 40' of FIGS. 7-8 differ from transistor 40 of FIGS. 3-6 in that emitter 42' of depth 44' and having width 43-1' and height 43-2' (e.g., see FIG. 8) is uniformly (e.g., N+) doped in plan view. Higher or lower doping may also be used. Blocking layer 43 is preferably retained having multiple openings and with closed portions 431 432, 433 analogous to those illustrated in FIGS. 3-6 so that SC-metal (e.g., silicide) contact 45 is provided in multiple contacts 452 in, for example, similar arrangement to those illustrated in FIGS. 3-6. Thus, multiple (e.g., silicided) individual emitter contacts 452i (collectively 452) of individual width 462i-1 and height 462i-2 are provided on emitter 42'. Streets 47m' of width 48m-1' and height 48m-2' of FIG. 8 between emitter contacts 452 are analogous in size, shape and location to elements 47m, 48m-1, and 48m-2 discussed in connection with FIGS. 3-6. It should be understood that (e.g., silicided) emitter contacts 452 may have the same variations in geometry illustrated for SE portions 42-2 in FIGS. 3-6, as well as other shapes and distributions not shown therein. The emitter contact area (ECA) is calculated in a manner analogous to determining the SEA described earlier. For example, ECA may be determined by summing the area of I individual emitter contacts 452i where i=1, 2, 3, . . . I. Assuming that the individual emitter contacts 452i have the same dimensions 462i-1, 462i-2, then ECA= I*(dimension 462i-1)*(dimension 462i-2). Persons of skill in the art will understand how to calculate ECA for other emitter and emitter contact configurations. It is desirable that ECA is less than the total emitter area (TEA), that is ECA<TEA. The ratio ECA/TEA is usefully about ≤0.95, more conveniently about ≤0.8, and preferably about ≤0.7, but higher or lower ECA/TEA ratios may be used, the exact choice depending upon the desired power handling capability and any limitations on overall device area that might be imposed by other design considerations. It is found that providing multiple emitter contacts 452i covering less than the total area of emitter 42' provides improved gain. This is desirable.

Figure 9A:
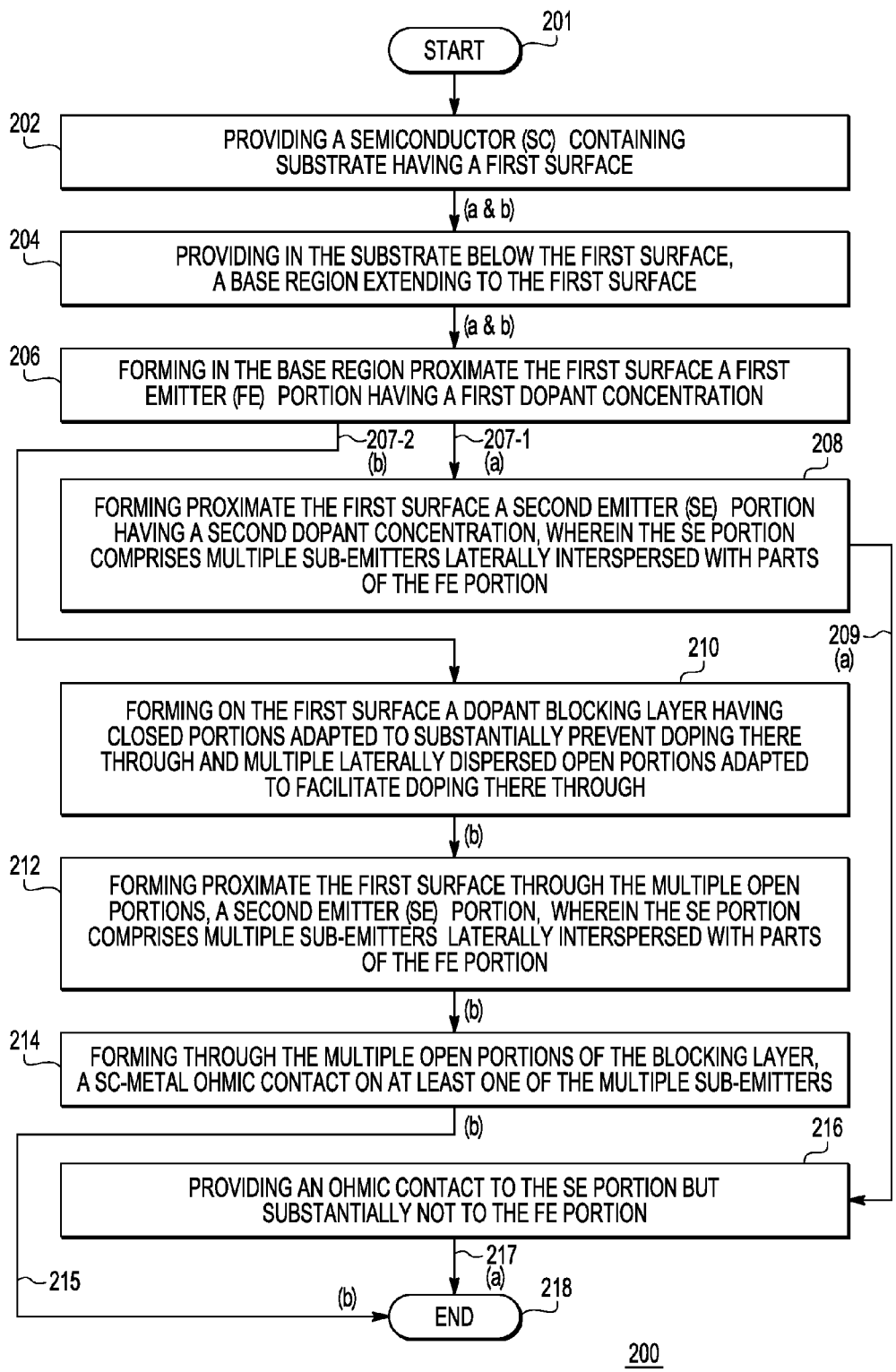
FIGS. 9A and 9B show simplified flow charts of methods of manufacture of the bipolar transistor of FIGS. 3-8 according to yet further embodiments of the invention.
Figure 9B:
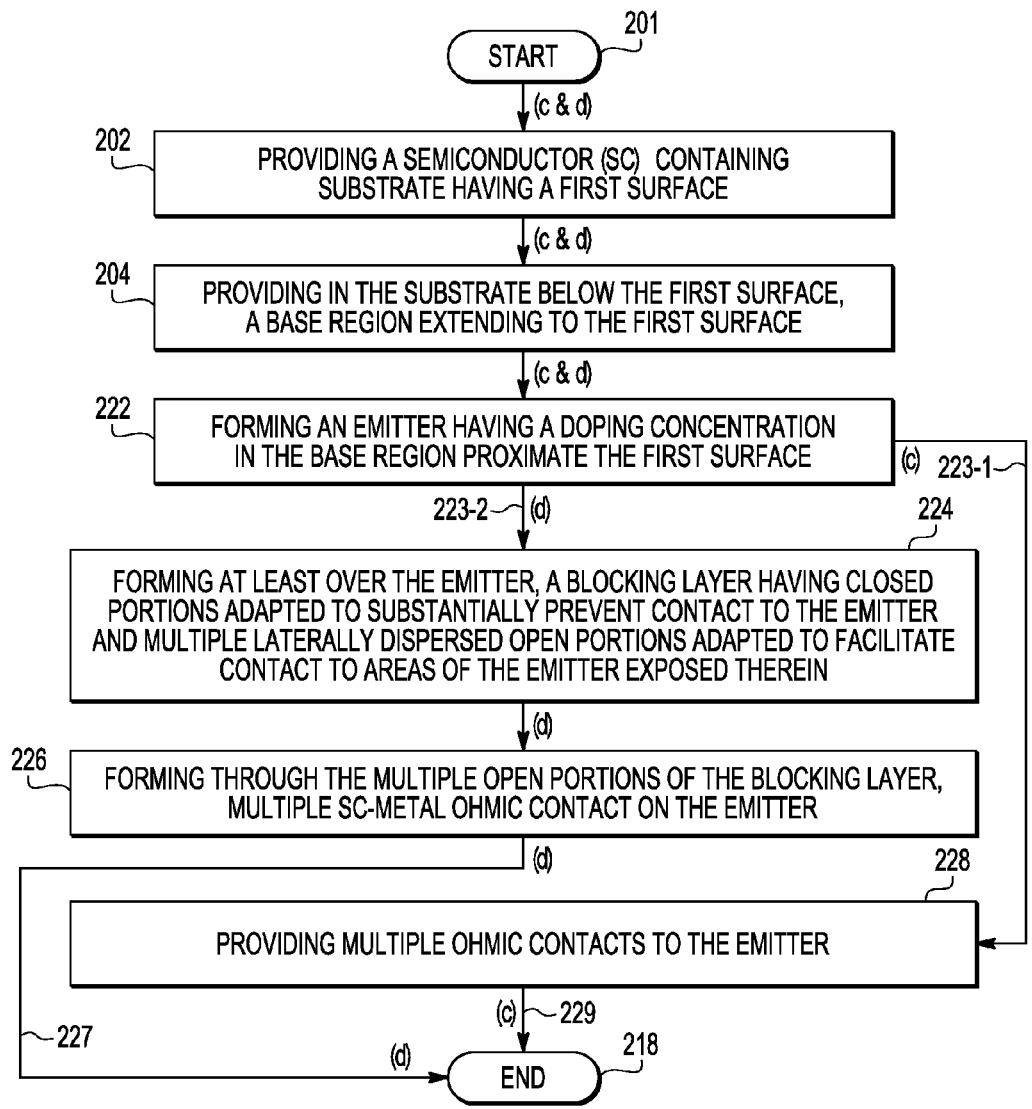

FIGS. 9A and 9B shows simplified flow charts of methods 200 and 220 of manufacture of bipolar transistors 40, 40' of FIGS. 3-8 according to still further embodiments of the invention. For convenience of description, the term "implant" is used throughout to refer to the act of doping various regions of devices 40, 40', but is not intended to be limiting merely to ion implantation. It is intended to include any means of providing the desired doped regions. Accordingly, the term "implant" is intended to be broadly construed as referring to "doping" by any means. Additionally, for convenience of description it is assumed in connection with methods 200 and 220 of FIGS. 9A and 9B and with FIGS. 10-18 that transistors 40 being formed are of the type illustrated in FIGS. 3-6, where the implant used to form SE portion 42-2 lies laterally within the implant used to form FE portion 42-1. In the illustrated manufacturing sequence, FE portion 42-1 is formed before SE 42-2, hence TEA is determined substantially by the area of the mask opening used to form FE portion 42-1. The implant to form SE portion 42-2 is then located laterally within the implant to form FE portion 42-1 so that FEA=TEA−SEA. However, in other embodiments, different mask shapes, locations and doping sequences may be used. Persons of skill in the art will understand how to modify the doping, the doping sequence and/or the doping and etch masks to produce other embodiments of the invention, as for example and not intended to be limiting, where the implant to form FE portion 42-1 and the implant to form SE portion 42-2 are located side by side in whole or part, or where some part of the implant to form SE portion 42-2 may lie laterally outside of the implant to form FE portion 42-1 or where portions 42-1, and 42-2 are formed in different orders.

Referring now to FIG. 9A, method 200 begins with start 201 and initial step 202 wherein a SC containing substrate (e.g., substrate 26 of FIG. 10) is provided having an upper or first surface (24). In step 204 there is formed in the substrate (26) below the first surface (24) a base region (25) extending to the first surface (24). In step 206, there is formed (e.g., see FIG. 14) in the base region (25) proximate the first surface (24), a first emitter (FE) portion (42-1) having a first dopant concentration ($C_{FE}$). Method 200 of FIG. 9A provides two implementations: implementation (a) follows steps 202, 204, 206, path 207-1 to step 208, path 209 to step 216, and then path 217 to END 218, and implementation (b) follows steps 202, 204, 206, path 207-2 to steps 210, 212, 214, and then path 215 to END 218.

Referring to implementation (a) of FIG. 9A, implementation (a) proceeds through steps 202, 204, 206, and via path 207-1 to step 208 wherein there is formed (e.g., see FIG. 16) proximate the first surface (24) a second emitter (SE) portion (42-2) having a second dopant concentration ($C_{SE}$), wherein the SE portion (42-2) comprises multiple sub-emitters (45i, 45j, 45k) laterally interspersed or mixed with parts (47m, 47n, 47p) of the FE portion (42-1). In step 216, there is provided (e.g., see FIG. 18) an Ohmic contact (452) to the SE portion (42-2) but substantially not to the FE portion (42-1). Implementation (a) then advances via path 217 to END 218.

Figure 15:
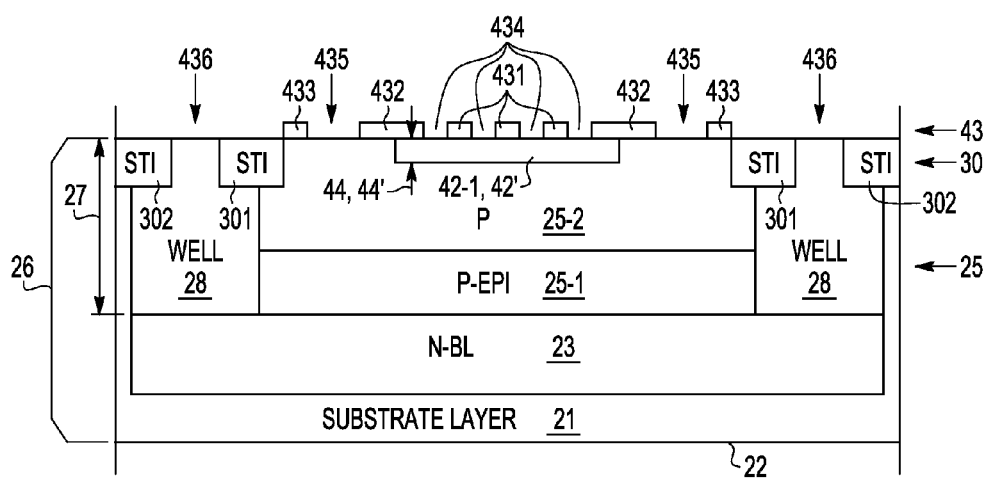

Referring now to implementation (b) of FIG. 9A, implementation (b) proceeds through steps 202, 204, 206, and via path 207-2 to step 210 wherein there is formed on the first surface (24) a dopant blocking layer (43) having closed portions (431, 432), e.g., see FIG. 15, adapted to substantially prevent doping there through, and having multiple laterally dispersed open portions (434, 435, 436) adapted to facilitate doping there through. In step 212 there is formed (e.g., see FIG. 16) proximate the first surface (24) through the multiple open portions (434), a second emitter (SE) portion (42-2) having a second dopant concentration ($C_{SE}$), wherein the SE portion (42-2) comprises multiple sub-emitters (45i, 45j, 45k) laterally interspersed or mixed with parts (47m, 47n, 47p) of the FE portion (42-1). In step 214, there is formed (e.g., see FIG. 18) through the multiple open portions (434) of the blocking layer (43), a SC-metal Ohmic contact (452) on at least one of the multiple sub-emitters (45i). Implementation (b) then advances via path 215 to END 218.

Referring now to FIG. 9B, method 220 begins with start 201 and initial step 202 wherein a SC containing substrate (e.g., substrate 26 of FIG. 10) is provided having an upper or first surface (24). In step 204 there is formed in the substrate (26) below the first surface (24) a base region (25) extending to the first surface (24). In step 222, there is formed (e.g., see FIG. 14) an emitter (42') in the base region (25) proximate the first surface (24). Method 220 of FIG. 9B provides two implementations. Implementation (c) follows steps 202, 204, 222, path 223-1 to step 228, and path 229 to END 218. Implementation (d) follows steps 202, 204, 222, path 223-2 to steps 224, 226, and path 227 to END 218.

Referring to implementation (c) of FIG. 9B, implementation (c) proceeds through steps 202, 204, 222 described above, and via path 223-1 to step 228 wherein there is provided (e.g., see FIG. 18) multiple Ohmic contacts (452i) to the emitter (42') and then via path 229 to END 218. Referring to implementation (d) of FIG. 9B, implementation (d) proceeds through steps 202, 204, 222 described above, and via path 223-2 to step 224. In step 224 there is formed (e.g., see FIG. 15) at least over the emitter (42'), a blocking layer (43) having closed portions (431, 432) adapted to substantially prevent contact to the emitter (42') and multiple laterally dispersed open portions (434)) adapted to facilitate contact to areas (424) of the emitter (42') exposed therein. In step 226 there is formed through the multiple open portions (434) of the blocking layer (43), multiple SC-metal Ohmic contacts (452i) on the emitter (42'). Implementation (d) then proceeds via path 227 to END 218.

FIGS. 10-18 show simplified cross-sectional views of bipolar transistors 40 of FIGS. 3-6 during various stages 308-316 of manufacture, illustrating resulting structures 408-416, according to yet further embodiments of the invention. For convenience of explanation, it is presumed in FIGS. 10-18 that devices of the type illustrated particularly in FIGS. 3-6 are being fabricated, but persons of skill in the art will understand based on the description herein how to modify the various mask shapes defining FE portion 42-1 and SE portion 42-2 and emitter contact 452 to provide other embodiments. In addition, the manufacturing process is described for silicon semiconductor and NPN transistors, but this is merely for convenience of description and not intended to be limiting, and other semiconductor materials may be used and other transistor types may be created with appropriate changes in conductivity type, which changes in material and conductivity type are within the competence of persons of skill in the art.

Figure 10:
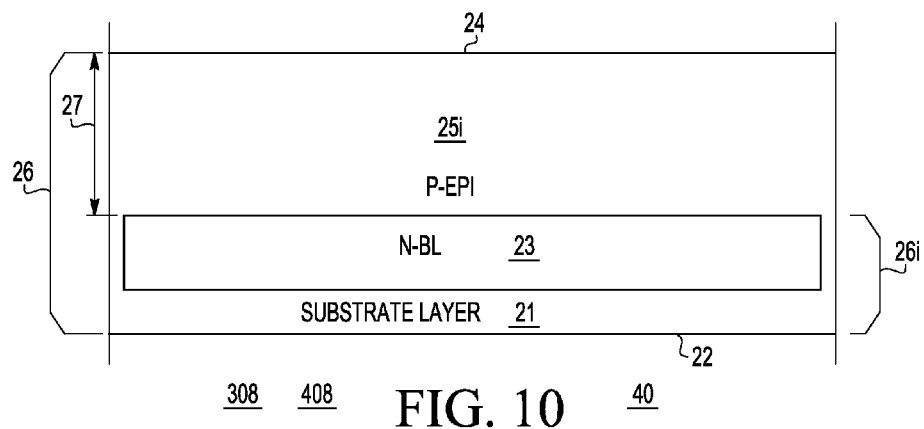
FIGS. 10-18 show simplified cross-sectional views of the bipolar transistors of FIGS. 3-8 during various stages of manufacture according to still yet further embodiments of the invention.
Figure 11:
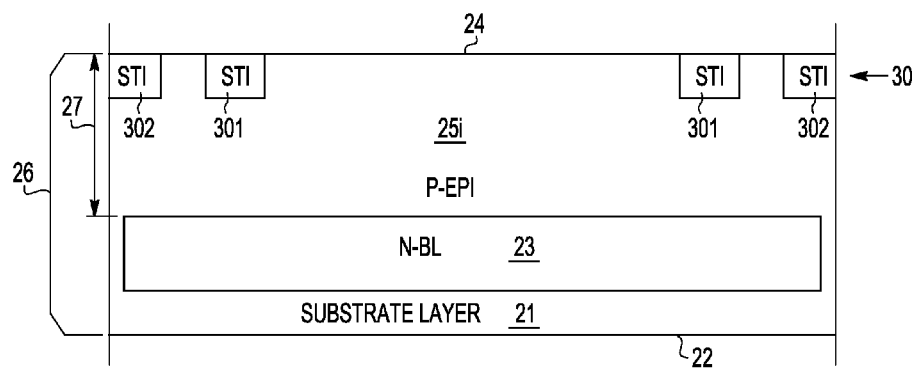

Referring now to manufacturing stage 308 of FIG. 10, substrate 26 having lower surface 22 and upper or first surface 24 is provided, having therein (e.g., P-type) foundation substrate layer 21, (e.g., N type) buried layer (BL) 23 and (e.g., P type) initial base region 25i of thickness 27 extending from BL 23 to upper or first surface 24. In a preferred embodiment, initial substrate 26i is provided comprising foundation substrate layer 21, an upper portion of which is doped in part to form (e.g., N type) BL 23. In a preferred embodiment, (e.g., P type) initial base region 25i is formed on initial substrate 26i by epitaxial deposition to provide substrate 26. Accordingly, initial base region 25i is identified in FIG. 10 as being "P-EPI", but this is merely to indicate a preferred embodiment and not to be limiting. Persons of skill in the art will understand that substrate 26 may be formed in a variety of other ways well known in the art. For example, BL 23 may be formed therein by ion implantation after initial base region 25i is in place or formed in a non-epitaxial substrate. Either implementation is useful. BL 23 has (e.g., N type) doping usefully in the range of about 1E16 to 1E20 $cm^{-3}$, more conveniently in the range of about 1E17 to 1E19 $cm^{-3}$, and preferably about 2E18 $cm^{-3}$, but higher and lower doping can also be used. Initial base region (e.g., P type EPI) 25i has doping usefully in the range of about 1E14 to 1E20 $cm^{-3}$, more conveniently in the range of about 5E15 to 1E18 $cm^{-3}$, and preferably about 2E15 $cm^{-3}$, but higher and lower doping can also be used. Structure 408 results. Referring now to manufacturing stage 309 of FIG. 11, shallow trench isolation (STI) regions 30 comprising portions 301, 302 are provided in surface 24 of substrate 26 using means well known in the art. Structure 409 results.

Figure 12:
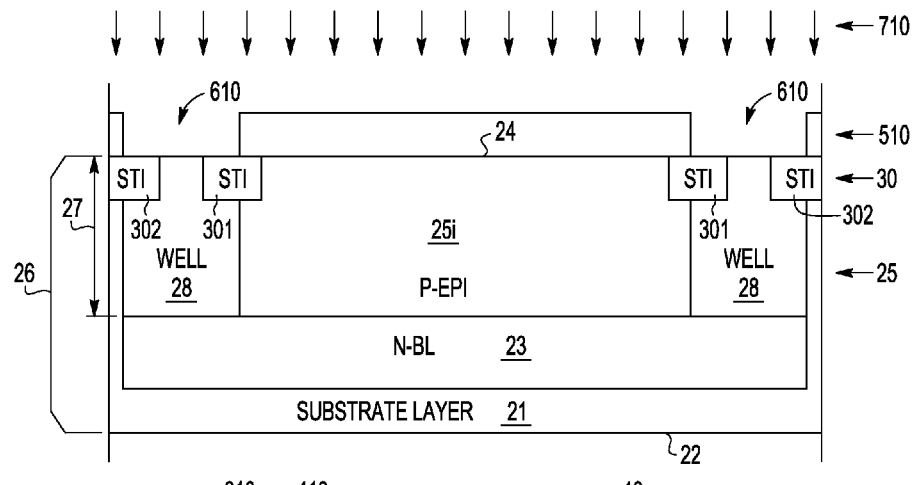

Referring now to manufacturing stage 310 of FIG. 12, mask 510 having openings 610 is provided over surface 24, through which (e.g., N type) implant 710 is provided, thereby forming (e.g., N type) WELL regions 28 extending in the indicated locations from surface 24 to BL 23 to make Ohmic contact thereto. Ion implantation of a combination of phosphorous, arsenic, and antimony is a preferred means of doping WELL regions 28, but other doping means and dopants may also be used. It is desirable that WELL regions 28 have doping usefully in the range of about 1E16 to 1E20 $cm^{-3}$, more conveniently in the range of about 1E17 to 1E19 $cm^{-3}$, and preferably about 1E18 $cm^{-3}$, but higher or lower doping may also be used. Structure 410 results.

Figure 13:
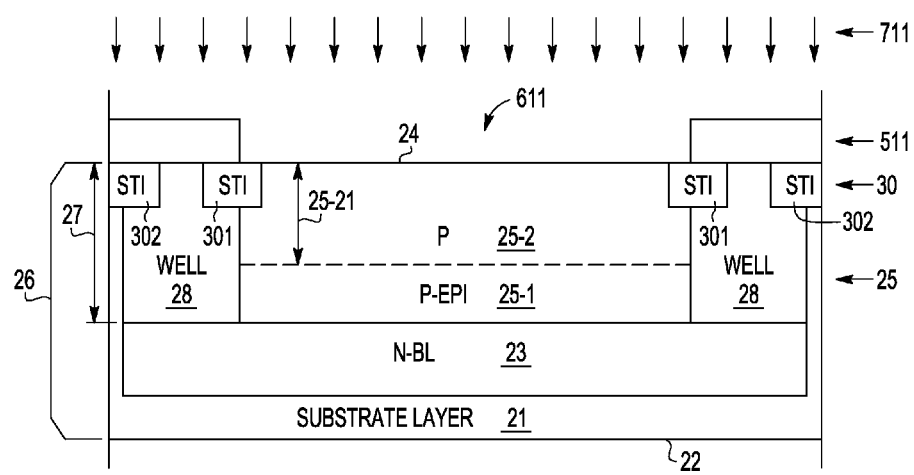

Referring now to manufacturing stage 311 of FIG. 13, mask 510 is replaced with mask 511 having opening 611 over surface 24, through which (e.g., P type) implant 711 is provided, thereby forming (e.g., P type) upper base region 25-2 of depth or thickness 25-21 below surface 24. This leaves between upper base region 25-2 and BL 23, lower base region 25-1 whose dopant concentration is determined, in this example, by the doping of initial (e.g., EPI) region 25i of manufacturing stage 308. Ion implantation of, for example, a combination of boron and indium is a preferred means of doping upper base region 25-2, but other doping means and dopants well known in the art may also be used. Lower base region 25-1 and upper base region 25-2 are referred to collectively as base region 25. It is desirable that upper base region 25-2 have doping usefully in the range of about 1E15 to 1E20 $cm^{-3}$, more conveniently in the range of about 1E16 to 1E18 $cm^{-3}$, and preferably about 2E17 $cm^{-3}$, but higher or lower doping may also be used. Depth or thickness 25-21 of upper base region 25-2 is usefully in the range of about 0.25 to 5 micrometers, more conveniently in the range of about 0.4 to 3 micrometers and preferably about 1.0 micrometers, but greater or smaller depths or thicknesses may be used. Depth or thickness 27 of combined base region 25 is usefully in the range of about 0.25 to 7.5 micrometers, more conveniently in the range of about 0.4 to 5 micrometers and preferably about 1.5 micrometers, but greater or smaller depths or thicknesses may be used. Structure 411 results.

Figure 14:
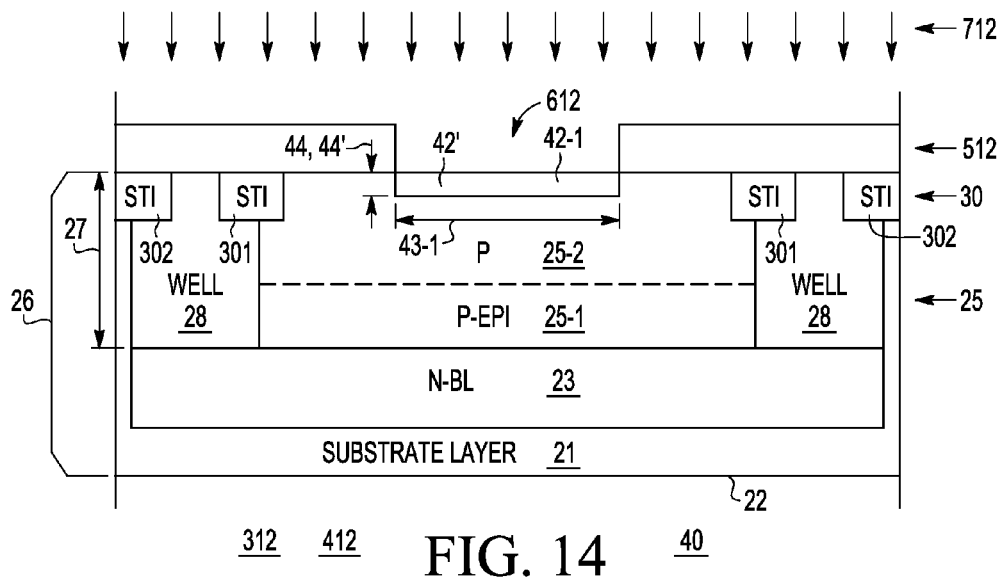

Referring now to manufacturing stage 312 of FIG. 14, mask 511 is replaced with mask 512 having opening 612 over surface 24, through which (e.g., N type) implant 712 is provided, thereby forming (e.g., N type) either: (i) first emitter (FE) portion 42-1 of depth or thickness 44 below surface 24 and, in this example, lateral width 43-1, corresponding to method 200 of FIG. 9A, or (ii) emitter 42' of depth 44' corresponding to method 220 of FIG. 9B. Unless otherwise specifically noted in connection with FIGS. 15-18, it is assumed method 200 is being implemented, but persons of skill in the art will understand how to modify the illustrated steps to follow method 220. Ion implantation of, for example, phosphorous is a preferred means of doping first emitter (FE) portion 42-1 or emitter 42', but other doping means and dopants well known in the art may also be used. Doping concentrations for FE portion 42-1 are described in connection with the discussion of FIGS. 3-6. The doping density of emitter 42' can correspond to what has been already described for second emitter portions 42-2, but higher or lower doping can also be used. Depth 44 is usefully in the range of about 0.05 to 1.0 micrometers, more conveniently in the range of about 0.1 to 0.5 micrometers and preferably about 0.25 micrometers, but greater or smaller depths or thicknesses may be used. Structure 412 results.

Referring now to manufacturing stage 313 of FIG. 15, mask 512 is removed, and blocking layer 43 is deposited over surface 24 and then patterned to provide, for example, closed portions 431, 432, 433 and open portions 434, 435, 436. The purpose of blocking layer 43 is to locally mask substrate 26 under the closed portions of layer 43 against dopants used to form SE portion 42-2, for example in locations 424 through open portions 434 of layer 43, and to facilitate formation of a SC-metal compound or alloy on regions 424 of SE portion 42-2 or regions 424 of emitter 42' (and other SC portions of surface 24) exposed in openings 434, 435, 436 in blocking layer 43, while precluding formation of such SC-metal compound or alloy on other parts of surface 24 of SC substrate 26 lying beneath closed portions 431, 432, 433 of blocking layer 43. Stated another way, blocking layer 43 may be regarded as a layer blocking entry of material under closed portions 431, 432, 433 while permitting entry of materials via open portions 434, etc., where the materials are: (i) dopant materials in the case of forming second emitter regions 42-2, or (ii) emitter contact forming materials in the case of forming emitter contacts 452, or (iii) both where both SE portions 42-2 and emitter contacts 452 are formed using blocking layer 43. Blocking layer 43 is typically an oxide or nitride or a combination thereof In a preferred embodiment, a lower layer, of e.g., silicon oxide, has thickness usefully in the range of about 1 to 1000 milli-micrometers, more conveniently in the range of about 2 to 100 milli-micrometers and preferably about 15 milli-micrometers, but larger and smaller thicknesses and other materials may also be used. An upper layer, of e.g., silicon nitride, has thickness usefully in the range of about 1 to 1000 milli-micrometers, more conveniently in the range of about 2 to 500 milli-micrometers and preferably about 95 milli-micrometers, but larger and smaller thicknesses and other materials may also be used. It will be understood by those of skill in the art that the number and locations of open and closed portions in blocking layer 43 will vary depending upon the number and locations of sub-emitters 45$i$, 45$j$, 45$k$ and/or the number and location of emitter contacts 452$i$ being used in a particular embodiment of the invention. Structure 413 results. While use of blocking layer 43 is preferred, in additional embodiments, blocking layer 43 may be omitted and, for example, sub-emitters 45$i$, 45$j$, 45$k$ and other regions whose final dimensions are described herein as being provided by openings in blocking layer 43, defined by appropriate openings in mask 514 of FIG. 16 and subsequent masks. Similarly, blocking layer 43 may be omitted and emitter contacts 452$i$ defined by other masks (not shown) provided in connection with contact metallization and/or silicide formation step or steps. Either arrangement is useful.

Figure 16:
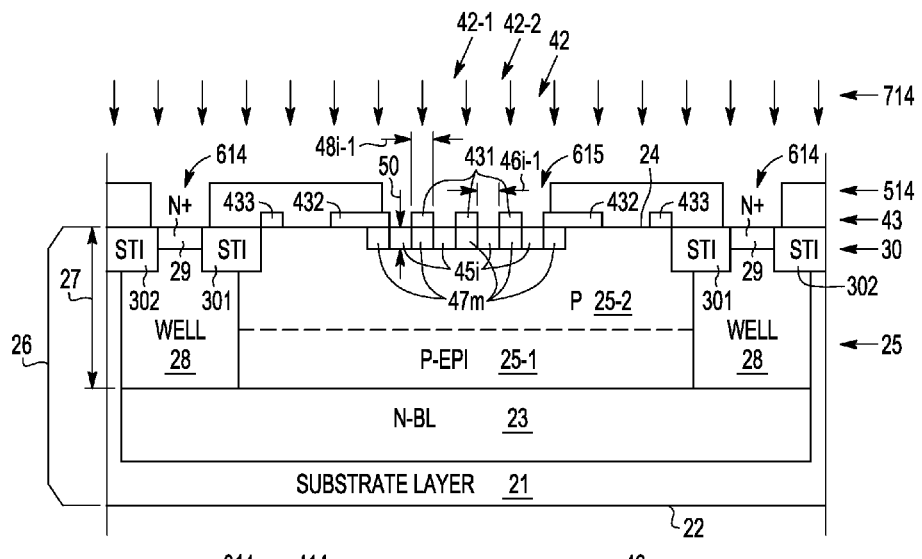

Referring now to manufacturing stage 314 of FIG. 16, mask 514 is provided over surface 24. In a preferred embodiment, mask 514 has openings 614, 615 through which (e.g., N type) implant 714 is provided, thereby forming (e.g., N+) collector contacts 29 under openings 614 and (e.g., N+) SE portion 42-2 (e.g., sub-emitters 45$i$ of FIG. 16) of depth or thickness 50 below surface 24 under opening 615. (If method 220 is being followed wherein SE portions 42-2 are not provided separately (e.g., where $C_{SE}=C_{FE}$), this step may be limited to formation of collector contacts 29, and where emitter 42' uses a similar doping level as collector contacts 29, emitter 42' and collector contacts 29 may be formed in a single combined doping step.) Depth 50 may be the same or different than depth 44 of FE portion 42-1 (e.g., portions 47$m$ of FIG. 16) formed in manufacturing stage 312 of FIG. 14. In addition to mask 514, SE portion 42-2 is laterally defined by closed portions 431 and open portions 434 (see FIG. 15) of blocking layer 43 lying laterally within mask opening 615. Open portions 434 (see FIG. 15) of blocking layer 43 in opening 615 permit dopant 714 to create multiple sub-emitters 45$i$ of individual width 46$i$-1 illustrated in FIGS. 3-4 and 16 of SE emitter portion 42-2, each separated by parts 47$m$ of FE portion 42-1 underlying closed portions 431 of blocking layer 43. Ion implantation of, for example, a combination of phosphorous and arsenic is a preferred means of doping SE portion 42-2, but other doping means and dopants well known in the art may also be used. It will be understood by those of skill in the art that the energy of implant 714 used to form SE portion 42-2 should be adjusted in consideration of the thickness and material of blocking layer 43 so that layer 43 can substantially block implant 714 under closed portions 431, 432, etc. With blocking layer 43 such as has been described above, implant energies in the range of about 30 KeV or lower are useful, but higher or lower energies may also be used depending upon the choices that have been made by the user for the dopant and the materials and thicknesses of blocking layer 43. Such choices are within the competence of those of skill in the art. Doping concentrations for SE portion 42-2 are described in connection with the discussion of FIGS. 3-6. Structure 414 results. Emitter-base junction depth 50 under SE portion 42-2 with emitter contact 452 is illustrated as being substantially equal to depth 44 of FE portion 42-1 (see FIG. 14) but may be larger or smaller in other embodiments. When implant 714 used to form SE portion 42-2 has a depth equal to or shallower than implant 712 used to form FE portion 42-1 in FIG. 14, the emitter-base junction depth across emitter 42 is substantially determined by depth 44. In yet other embodiments, depth 50 may be greater than depth 44 when implant 714 is deeper than implant 712 so that the emitter-base junction depth varies across emitter 42. Either arrangement is useful. While the foregoing has been described for forming sub-emitters 45$i$, 47$m$, persons of skill in the art will understand that substantially the same procedure, with appropriate mask shape changes, can be used to form sub-emitters 45$j$, 47$n$ and 45$k$, 47$p$ and other combinations.

Figure 17:
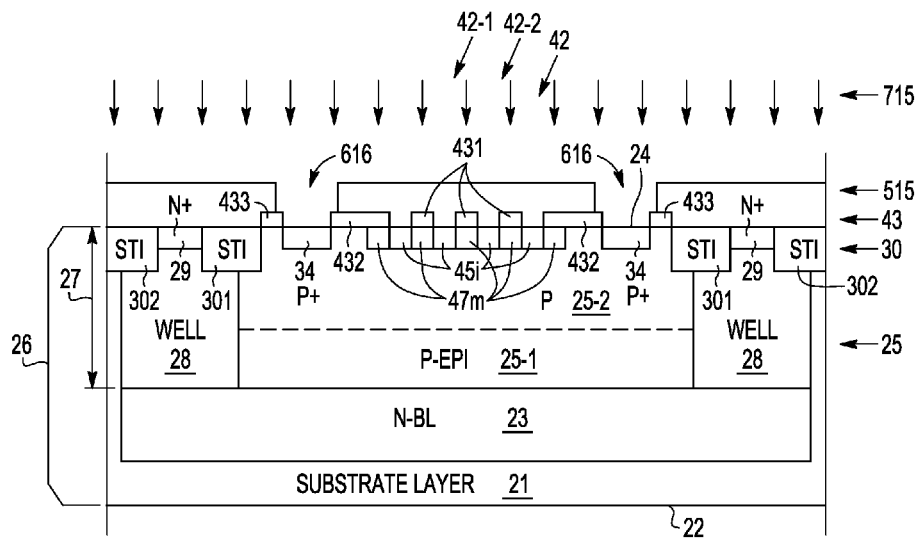

Referring now to manufacturing stage 315 of FIG. 17, mask 514 is replaced with mask 515 having openings 616 over surface 24, through which (e.g., P+) implant 715 is provided, thereby forming (e.g., P+) base contact regions 34 under openings 616. In this example, the lateral width and location of base contact regions 34 are preferably defined by the lateral gap between portions 432, 433 of blocking layer 43, but in other embodiments, their lateral width and location may be determined substantially by openings 616 when, for example, blocking layer 43 is not used. Ion implantation of, for example, boron is a preferred means of doping base contact regions 34, but other doping means and dopants well known in the art may also be used. It will be understood by those of skill in the art that the energy of implant 715 used to form base contact regions 34 should be adjusted in consideration of the thickness and material of blocking layer 43 so that layer 43 can substantially block implant 715 under closed portions 432, 433. With blocking layer 43 such as has been described above, implant energies in the range of about 5 KeV or lower are useful, but higher or lower energies may also be used depending upon the choices that have been made by the user for the dopant and the materials and thicknesses of blocking layer 43. Such choices are within the competence of those of skill in the art. It is desirable that base contact regions 34 have doping usefully in the range of about 1E19 to 2E22 cm$^{-3}$, more conveniently in the range of about 1E20 to 1E22 cm$^{-3}$, and preferably about 1E21 cm$^{-3}$, but higher or lower doping may also be used. Structure 415 results.

Figure 18:
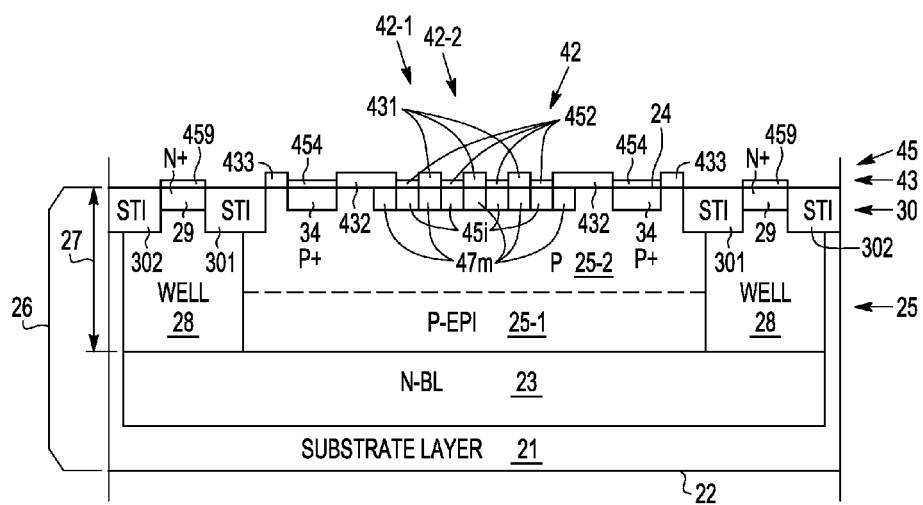

Referring now to manufacturing stage 316 of FIG. 18, mask 515 is removed, and SC-metal compound or alloy forming layer 45 is deposited over surface 24 and blocking layer 43, wherein blocking layer 43 has closed portions 431, 432, 433 and open portions 434, 435, 436 (see FIG. 15). The material of layer 45 is preferably chosen from the class of electrical conductors that readily alloys with or forms electrically conductive compounds with the SC being used for transistor 40 but that do not form such compounds with the material of blocking layer 43 or exposed portions of STI regions 30. For devices where surface 24 comprises silicon SC, titanium, cobalt, nickel, platinum and/or combinations thereof are useful for layer 45. Thickness in the range of about 1 to 100 milli-micrometers are useful, more conveniently in the range of about 2 to 50 milli-micrometers, and preferably about 10 milli-micrometers, but other conductors and other thicknesses may be used on silicon and other SC materials. When the material of layer 45 is deposited (e.g., by RF sputtering) and heat treated (e.g., at about 450 to 800 degrees centigrade for 0.5 to 2 minutes), layer 45 alloys or forms an electrically conductive compound (e.g., a silicide) with the semiconductor of surface 24 where it is exposed through openings 434-436 (see FIG. 15) of blocking layer 43 but does not alloy or form such compound with closed portions 431-433 of blocking layer 43 or with exposed portions of STI regions 30. It is well known that the un-alloyed or otherwise un-reacted portions of alloy forming layer 45 over blocking layer 43 and STI regions 30 may be easily removed, for example, by a brief etch. This leaves in place SC-metal alloy or electrically conductive compound (e.g., silicided) contacts 452, 454, 459 on SE portion 42-2, base contact regions 34 and collector contact regions 29 respectively, but no alloyed (e.g., silicided) contacts on FE portion 42-1, which is still covered by portions 431, 432 of blocking layer 43. Cobalt silicide is preferred for contacts 452, 454, 459. Structure 416 results, which brings transistor 40 of FIGS. 3-8 close to completion. What remains is to provide electrical connections from (e.g. silicided) contacts 452, 454, 459 to terminals 36, 37, 38 respectively, shown in FIGS. 3 and 7 (or such other connections as may be desired) and providing overlying passivation layer 39 (illustrated in FIGS. 3 and 7), which "back-end" operations are well known in the art. Persons of skill in the art will also understand that while use of blocking layer 43 is preferred for forming (e.g., silicided) contacts 45 and especially emitter contacts 452i, that any convenient mask with corresponding openings may be used in place of blocking layer 43.

It will be apparent that manufacturing stages 308-316 are adapted to provide transistors 40, 40' illustrated in FIGS. 3-8 having the desired configuration, so that in FIGS. 3-6 emitter 42 comprises FE portion 42-1 and SE portion 42-2 that are adjacent, laterally mixed, and/or interspersed and with SE portions 42-2 having emitter contact 452 thereon, and so that in FIGS. 3-8 where emitter 42, 42' may have laterally uniform doping, multiple emitter contacts 452i are provided on emitter 42, 42' so that the emitter contact area (ECA) is less than the total emitter area (TEA). In a preferred embodiment, $C_{SE} \geq C_{FE}$. In a further embodiment, the second emitter area (SEA) is desirably smaller than the first emitter area (FEA). In a still further embodiment, emitter 42 (i.e., SE+FE) has SC-metal alloy or compound (e.g., silicided) emitter contact 452 substantially on SE portion 42-2 but substantially not on FE portion 42-1. In this way, the area (ECA) of alloyed or SC-metal compound (e.g., silicided) emitter contact 452 is substantially equal to the SEA, and in a preferred embodiment, is smaller than the FEA, where FEA=TEA−SEA. In a still yet further embodiment, the doping concentration $C_{FE}$ of FE portion 42-1 and the doping concentration $C_{SE}$ of SE portion 42-1 may be substantially equal provided that SC-metal alloy or compound emitter contact 452 is provided substantially only on SE portion 42-2, or emitter 42' has substantially uniform doping in plan view and ECA<TEA. As illustrated in Table I, substantial (e.g., up to ~278%) increase in current gain (e.g., beta) is obtained. This is very desirable.

According to a first embodiment, there is provided a bipolar transistor (40, 40') having a first surface (24), and comprising, a base (25) of a first conductivity type, a collector (23, 28) of a second, opposite, conductivity type in contact with the base (25), an emitter (42, 42') of the second conductivity type extending into the base (25) at the first surface (24), the emitter (42, 42') having a first emitter (FE) portion (42-1) and a second emitter (SE) portion (42-2), and a semiconductor-metal Ohmic emitter contact (452) substantially on the SE portion (42-1) and substantially not on the FE portion (42-1). According to a further embodiment, the FE portion (42-1) has a FE dopant concentration $C_{FE}$ and the SE portion (42-2) has a SE doping dopant concentration $C_{SE}$, and $C_{SE} \geq C_{FE}$. According to a still further embodiment, $C_{SE}$ substantially equals $C_{FE}$ and the SE portion (42-2) is the portion of the emitter (42, 42') having thereon the Ohmic emitter contact (452). According to a yet further embodiment, SE dopant concentration $C_{SE}$ and the FE dopant concentration $C_{FE}$ have a ratio $C_{SE}/C_{FE}$ in a range of about $C_{SE}/C_{FE}=1$ to 10000. According to a still yet further embodiment, the SE portion (42-2) is laterally mixed with at least part of the FE portion (42-1). According to a yet still further embodiment, a part of the FE portion (42-1) is substantially laterally interspersed with the SE portion (42-2). According to another embodiment, the FE emitter portion (42-1) comprises a plurality of first sub-emitters (47m, 47n, 47p) and the SE portion (42-2) comprises a plurality of second sub-emitters (45i, 45j, 45k) that are at least in part adjacent to or mixed with the first sub-emitters (47m, 47n, 47p) or both. According to a still another embodiment, the plurality of second sub-emitters (45i, 45j, 45k) are substantially electrically coupled in parallel. According to a yet another embodiment, the emitter (42) comprises silicon and the semiconductor-metal Ohmic emitter contact (452) comprises a silicide.

According to second embodiment, there is provided a method (200, 220) for forming a bipolar transistor (40, 40'), comprising the steps of, providing a semiconductor (SC)

containing substrate (26) having a first surface (24), and with a base region (25) therein extending to the first surface (24), forming in the base region (25) proximate the first surface (24) an emitter (42, 42') comprising a first emitter (FE) portion (42-1) of a first dopant concentration $C_{FE}$ and a second emitter (SE) portion (42-2) of a second dopant concentration $C_{SE}$, and providing multiple Ohmic contacts (452i) on the emitter (42, 42'), substantially on the SE portion (42-2) but substantially not on the FE portion (42-1). According to a further embodiment, the method (200, 220) further comprises prior to the step of providing the multiple Ohmic contacts (452i), forming on the first surface (24) at least partly over the emitter (42, 42') a dopant blocking layer (43) having closed portions (431, 432) adapted to substantially prevent entry of materials there through and multiple laterally dispersed open portions (434) adapted to facilitate entry of materials there through, and wherein the materials are dopant materials for forming the second emitter portions (42-2) or electrical contact materials for forming the Ohmic contacts (452i) or both. According to a still further embodiment, the SE portion (42-2) comprises multiple sub-emitters (45i, 45j, 45k) laterally mixed with or adjacent to parts (47m, 47n, 47p) of the FE portion (42-1) or both. According to a yet further embodiment, $C_{SE} \geq C_{FE}$. According to a still yet further embodiment, the emitter (42, 42') has a total lateral emitter area (TEA) and the Ohmic contacts (452i) have a total lateral emitter contact area (ECA) and ECA<TEA. According to a yet still further embodiment, the emitter (42, 42') has a total lateral emitter area (TEA) and the second emitter portion (42-2) has a total lateral second emitter area (SEA) and SEA<TEA. According to another embodiment, SEA≤0.95*TEA.

According to a third embodiment, there is provided a semiconductor (SC) substrate (26), comprising, an emitter (42, 42'), a base (25) and a collector (23, 28), wherein the emitter (42, 42') laterally has a total emitter area (TEA), wherein the emitter (42, 42') has a first emitter (FE) portion (42-1) laterally of a first emitter area (FEA) and a second emitter (SE) portion (42-2) laterally of a second emitter area (SEA), wherein the FE portion (42-1) and the SE portion (42-2) are electrically coupled to form the emitter (42, 42'), and an Ohmic contact (452) formed from a metal-SC compound or alloy substantially on the SE portion (42-2) and not on the FE portion (42-1). According to a further embodiment, the Ohmic contact (452) has an Ohmic emitter contact area (ECA) less than the TEA. According to a still further embodiment, the SE portion (42-2) having thereon the Ohmic contact (452), comprises, multiple sub-emitters (45i, 45j, 45k) each with a part (452i) of the Ohmic contact (452) thereon, said sub-emitters (45i, 45j, 45k) with the part (452i) of the Ohmic contact (452) thereon being laterally intermingled with or adjacent to parts (47m, 47n, 47p) of the FE portion (42-1) or both. According to a yet further embodiment, the FE portion (42-1) has a FE doping concentration $C_{FE}$ and the SE portion (42-2) has a SE doping concentration $C_{SE}$ and $C_{SE} \geq C_{FE}$.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a bipolar transistor, comprising the steps of:
    providing a semiconductor (SC) containing substrate having a first surface, and with a base region therein extending to the first surface;
    forming in the base region proximate the first surface an emitter comprising a first emitter (FE) portion of a first dopant concentration $C_{FE}$ and a second emitter (SE) portion of a second dopant concentration $C_{SE}$; and
    providing multiple Ohmic contacts on the emitter, substantially on the SE portion but substantially not on the FE portion.

2. The method of claim 1, further comprising:
    prior to providing the multiple Ohmic contacts, forming on the first surface at least partly over the emitter a dopant blocking layer having closed portions adapted to substantially prevent entry of materials therethrough and multiple laterally dispersed open portions adapted to facilitate entry of the materials therethrough.

3. The method of claim 2 wherein the materials comprise at least one of the group consisting of dopant materials for forming the second emitter portions and electrical contact materials for forming the Ohmic contacts.

4. The method of claim 1, wherein the emitter is formed such that the SE portion comprises multiple sub-emitters laterally mixed with or adjacent to parts of the FE portion or both.

5. The method of claim 1, wherein the emitter is formed such that $C_{SE} \geq C_{FE}$.

6. The method of claim 1, wherein the emitter is formed to have a total lateral emitter area (TEA), wherein the Ohmic contacts are formed to have a total lateral emitter contact area (ECA), and wherein ECA<TEA.

7. The method of claim 1, wherein the emitter is formed to have a total lateral emitter area (TEA), while the second emitter portion has a total lateral second emitter area (SEA), and wherein SEA<TEA.

8. The method of claim 7, wherein the emitter is formed such that SEA≤0.95*TEA.

9. The method of claim 8, wherein forming comprises:
    forming the FE emitter portion to include a first plurality of sub-emitters; and
    forming the SE portion to include a second plurality of sub-emitters proximate the first plurality of sub-emitters.

10. The method of claim 9, wherein the second plurality of sub-emitters are substantially electrically coupled in parallel.

11. A method, comprising:
    providing a semiconductor (SC) containing substrate having a first surface, and with a base region therein extending to the first surface; and
    forming in the base region proximate the first surface an emitter comprising a first emitter (FE) portion of a first dopant concentration $C_{FE}$ and a second emitter (SE) portion of a second dopant concentration $C_{SE}$ of the same type dopant;
    wherein the emitter is formed such that $C_{SE} \geq C_{FE}$.

12. The method of claim 11 further comprising forming a semiconductor-metal Ohmic emitter contact substantially on the SE portion and substantially not on the FE portion.

13. The method of claim 11, wherein the SE dopant concentration $C_{SE}$ and the FE dopant concentration $C_{FE}$ have a ratio $C_{SE}/C_{FE}$ in a range of about $C_{SE}/C_{FE}=1$ to 10000.

14. The method of claim 11, wherein the emitter is formed such that the SE portion is laterally mixed with at least part of the FE portion.

15. The method of claim 14, wherein a part of the FE portion is substantially laterally interspersed with the SE portion.

16. The method of claim 11, wherein the emitter comprises silicon and the semiconductor-metal Ohmic emitter contact comprises a silicide.

17. A method, comprising:
- providing a semiconductor (SC) containing substrate having a first surface, and with a base region therein extending to the first surface; and
- forming in the base region proximate the first surface an emitter comprising a first emitter (FE) portion of a first dopant concentration $C_{FE}$ and a second emitter (SE) portion of a second dopant concentration $C_{SE}$;
- wherein the SE portion comprises multiple sub-emitters at least partially laterally interspersed with the FE portion.

18. The method of claim 17 further comprising forming an Ohmic contact from a metal-SC compound or alloy substantially on the SE portion and not on the FE portion.

19. The method of claim 17 wherein the emitter laterally has a total emitter area (TEA), wherein the Ohmic contact has an Ohmic emitter contact area (ECA), and wherein ECA<TEA.

20. The method of claim 17, further comprising forming the SE portion to include multiple sub-emitters each having a portion of the Ohmic contact thereon.

* * * * *